(12) United States Patent
Hirota

(10) Patent No.: US 8,547,082 B2
(45) Date of Patent: Oct. 1, 2013

(54) SEMICONDUCTOR DEVICE AND PULSE WIDTH DETECTION METHOD

(75) Inventor: Akihiro Hirota, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 323 days.

(21) Appl. No.: 13/012,869

(22) Filed: Jan. 25, 2011

(65) Prior Publication Data

US 2011/0181329 A1      Jul. 28, 2011

(30) Foreign Application Priority Data

Jan. 28, 2010   (JP) ................................. 2010-016654

(51) Int. Cl.
*G01R 13/00*   (2006.01)
*H03K 3/00*    (2006.01)

(52) U.S. Cl.
USPC ........................ 324/76.11; 702/69; 327/217

(58) Field of Classification Search
USPC .................... 324/76.11; 702/69; 327/217
See application file for complete search history.

(56) References Cited

U.S. PATENT DOCUMENTS

2010/0023289 A1*   1/2010   Miyazaki et al. ............... 702/69

FOREIGN PATENT DOCUMENTS

JP           2009-175052 A    8/2009

* cited by examiner

*Primary Examiner* — Jermele M Hollington
*Assistant Examiner* — Farhana Hoque
(74) *Attorney, Agent, or Firm* — Volentine & Whitt, PLLC

(57) ABSTRACT

An internal pulse waveform shaping circuit provided to an IC chip generates an internal pulse monitor signal that changes in a predetermined direction at a rise timing of an internal pulse signal during a period in which a first enable signal is asserted and a second enable signal is de-asserted and then continues in the changed state for a predetermined period of time or longer, and generates the internal pulse monitor signal that changes in the predetermined direction at a fall timing of the pulse signal during a period in which the first enable signal is de-asserted and the second enable signal is asserted and then continues in the changed state for the predetermined period of time or longer. The generated internal pulse monitor signal is output to a tester for detecting the pulse width of the internal pulse signal.

5 Claims, 8 Drawing Sheets

@Rdr=50Ω, Rpc=10mΩ, Cpc=80pF, Cc=40pF, PLS PULSE WIDTH = 6ns

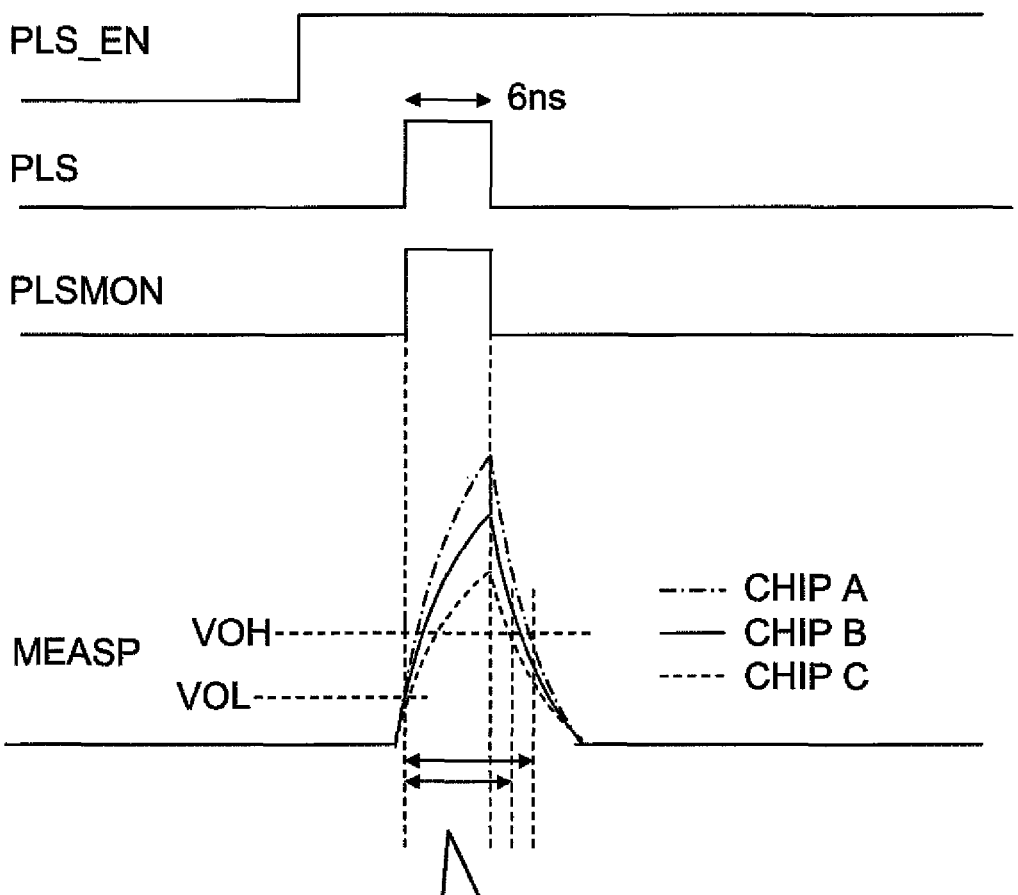

SEMICONDUCTOR DEVICE AND PULSE WIDTH DETECTION METHOD

CROSS-REFERENCE TO RELATED APPLICATION

This application claims priority under 35 USC 119 from Japanese Patent Application No. 2010-016654 filed on Jan. 28, 2010, the disclosure of which is incorporated by reference herein.

BACKGROUND

1. Technical Field

The present invention relates to a semiconductor device, and to a detection method for detecting the pulse width of a pulse signal generate in the semiconductor device.

2. Related Art

Explanation follows, with reference to FIG. 6, regarding a configuration and detection method for detecting a pulse width of a pulse signal (referred to below as an internal pulse signal) generated within a conventional semiconductor device, such as a semiconductor memory or the like.

As shown in FIG. 6, each chip of a semiconductor device is provided with a NAND circuit 30 input with an enable signal PLS_EN and an internal pulse signal PLS, and an inverter 31 that inverts the output from the NAND circuit 30. The signal output from the inverter 31 is an internal pulse monitor signal PLSMON (note that while the NAND circuit 30 and the inverter 31 are given as an example of a circuit for outputting the PLSMON, an AND circuit may also be employed).

When the enable signal PLS_EN becomes "H" (enable: asserted), the internal pulse monitor signal PLSMON of the same waveform as that of the internal pulse signal PLS is output from the inverter 31, and the PLSMON is also output externally to the chip through the monitor driver 32 and the monitor pad 33 functioning as a repeater.

Consider a case in which a probe needle 34 is contacted to the monitor pad 33 for measuring the internal pulse signal PLS. When the PLS_EN="H" (test mode), the waveform output to the monitor pad 33 is the waveform input through the probe needle 34, and is input through the probe card 35 to a tester comparator 36 for detecting a rise timing and a fall timing of the pulse signal. These timings are measured by the tester comparator 36 at the measurement point MEASP and the pulse width is derived based on these timings.

An example of a detection device is described in JP-A No. 2009-175052 for detecting the pulse width from the waveform at the measurement point MEASP. This device is equipped with: a first timing detection section for detecting a first change timing of the measured signal; a second timing detection section for detecting a second change timing of the measured signal; a buffer section for buffering data expressing the first change timing detected by the first timing detection section and data expressing the second change timing detected by the second timing detection section; and a computation section that imports the data expressing the first change timing and the second change timing from the buffer section and computes the difference in timing between the first change timing and the second change timing.

The above conventional technology suffers from the problem that, particularly when the internal pulse signal PLS is short, either the pulse width cannot be detected accurately or the test duration for accurately detecting the pulse increases.

FIG. 7 shows a waveform of each signal in a conventional method shown in FIG. 6. After the enable signal PLS_EN has changed from "L" to "H", the generated internal pulse signal PLS is output as the internal pulse monitor signal PLSMON. The waveform of the internal pulse monitor signal PLSMON is then output, through the monitor driver 32, the monitor pad 33, and the probe card 35, and measured at the measurement point MEASP by the tester comparator 36. However, as shown in FIG. 6, a delay (waveform rounding) is generated in the waveform at the measurement point MEASP by output impedance of the monitor driver 32 (Rdr), wiring resistance and capacitance (Rpc, Cpc) of the probe card 35, and load (Cc) of the tester comparator 36 present upstream of the measurement point. The time constant $\tau = (Rdr+Rpc) \times (Cpc+Cc)$.

As shown in FIG. 8, suppose the Rdr=50Ω, Rpc=10 mΩ, Cpc=80 pF, Cc=40 pF, and the pulse width of the internal pulse signal PLS=6 ns, then the time constant τ and the pulse width of the internal pulse signal PLS are of the same order of duration as each other. Since the internal pulse signal PLS falls off when the period of the time constant τ portion is still elapsing, the waveform at the measurement point MEASP only reaches 63.2% of the maximum voltage value VCC of the pulse signal.

Since at least the output impedance (Rdr) of the monitor driver 32 fluctuates due to transistor parameters, variation occurs in the amplitude of the waveform at the measurement point MEASP depending on the chip, as shown in FIG. 9. Suppose that a fixed determination point such as threshold value VOH/VOL is set for detecting the timing of the rise and fall of the pulse signals shown in FIG. 9, the possibility arises that different pulse width detection values will be detected depending on the chip even though the pulse width of the internal pulse signal PLS is actually the same 6 ns. Consequently, accurate pulse widths cannot be detected by this method.

In order to accurately measure the pulse width for individual chips, after measuring the amplitude (voltage values) of the waveform at the measurement point MEASP for each of the chips, individual determination levels need to be set (for example: for VOH=amplitude at MEASP −0.1V, VOL=0.1V), and the pulse width detected for each chip. However, a great deal of time is required for testing when serial processing each chip with such a method.

Note that in JP-A No. 2009-175052, while there is a description of a measurement method employed by the detection device (measurement device) external to the semiconductor device after the waveform has been imported, since delay of the above waveform occurs at the stage when the waveform is imported into the detection device, the technology described in JP-A No. 2009-175052 cannot solve the above problem.

SUMMARY

A first aspect of the present invention is a semiconductor device including a generation section and an output section. The generation section is input with a pulse signal generated in the semiconductor device, a first enable signal asserted when detecting a rise timing of the pulse signal, and is input with a second enable signal asserted when detecting a fall timing of the pulse signal. The generation section generates a first signal that changes in a predetermined direction at a rise timing of the input pulse signal, during a period in which the input first enable signal is asserted and then continues in a changed state for a predetermined duration or longer. The generation section generates a second signal that changes in the predetermined direction at a fall timing of the input pulse signal, during a period in which the input second enable signal is asserted and then continues in the changed state for the predetermined duration or longer. The output section outputs the generated first signal and the generated second signal to a detection device provided externally to the semiconductor device, the detection device for detecting the pulse width of the pulse signal based on the generated first signal and the generated second signal.

A second aspect of the present invention is a pulse width detection method for a semiconductor device including a generation section and an output section, the pulse width detection method including: inputting to the generation section a pulse signal generated in the semiconductor device, a first enable signal asserted when detecting a rise timing of the pulse signal generated in the semiconductor device, and a second enable signal asserted when detecting a fall timing of the pulse signal; generating at the generation section a first signal that changes in a predetermined direction at a rise timing of the input pulse signal, during a first period in which the input first enable signal is asserted and then continues in the changed state for a predetermined duration or longer; generating at the generation section a second signal that changes in the predetermined direction at a fall timing of the input pulse signal, during a second period in which the input second enable signal is asserted and then continues in the changed state for the predetermined duration or longer; outputting at the output section the generated first signal and the generated second signal to a detection device provided externally to the semiconductor device, the detection device for detection the pulse width of the pulse signal based on the generated first signal and the generated second signal; detecting at the detection device a first timing at which the first signal has changed in the predetermined direction by comparing the first signal output from the output section with a predetermined threshold value; the detecting at detection device a second timing at which the second signal has changed in the predetermined direction by comparing the second signal output from the output section with the predetermined threshold value; and detecting at the detection device the pulse width of the pulse signal generated in the semiconductor device in which the pulse width corresponds to a difference between a period of time from a first reference timing used at a reference timing for generating the pulse signal input in the first period up to the detected first timing, and a period of time from a second reference timing used as a reference timing for generating the pulse signal input in the second period up to the detected second timing.

BRIEF DESCRIPTION OF THE DRAWINGS

Exemplary embodiments of the present invention will be described in detail based on the following figures, wherein:

FIG. 9 is a diagram showing waveform amplitudes measured at a measurement point MEASP differing according to the chip.

DETAILED DESCRIPTION

A detailed explanation follows regarding a present exemplary embodiment, with reference to the drawings. Note that in the present exemplary embodiment, explanation is of an example for detecting the pulse width of a pulse signal generated within an IC chip during wafer testing prior to dicing up the wafer into individual IC chips.

Figure 1:
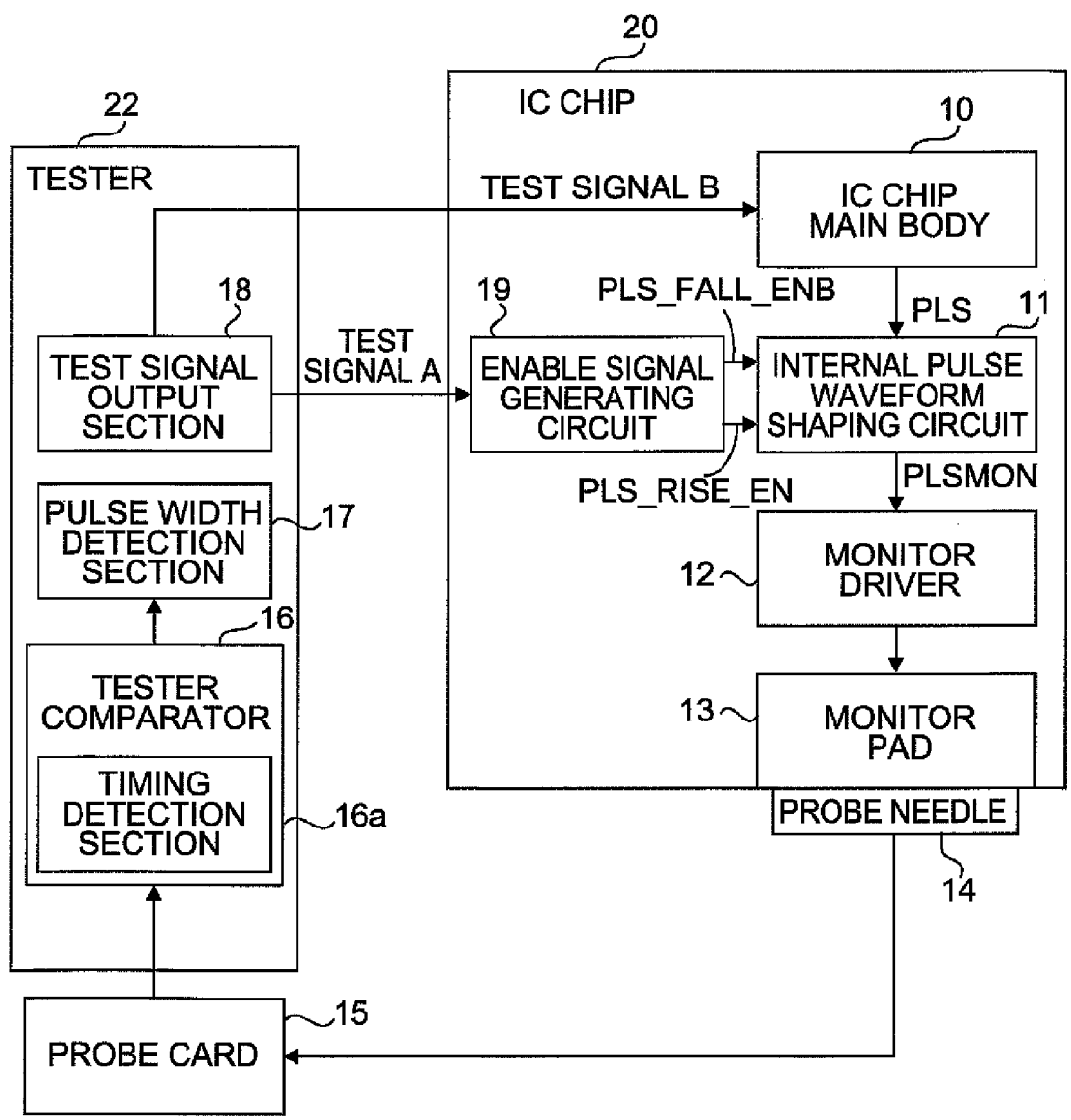
FIG. 1 is a diagram showing a configuration of an IC chip and a tester according to an exemplary embodiment.

FIG. 1 is a diagram showing a configuration of an IC chip 20 serving as an example of a semiconductor device, and a tester 22 serving as an example of a detection device for detecting the pulse width of a pulse signal generated in the IC chip 20. Note that while there are plural IC chips 20 formed on a wafer, in the present exemplary embodiment only one IC chip 20 is shown as a representative thereof.

The IC chip 20 includes an IC chip main body 10, an internal pulse waveform shaping circuit 11, a monitor driver 12, a monitor pad 13, and an enable signal generating circuit 19.

The tester 22 includes a tester comparator 16, a pulse width detection section 17, and a test signal output section 18.

When a test signal A is input from the test signal output section 18 of the tester 22, in response to the test signal A the enable signal generating circuit 19 of the IC chip 20 inputs each of a first enable signal PLS_RISE_EN and a second enable signal PLS_FALL_ENB to the internal pulse waveform shaping circuit 11. In the present exemplary embodiment, the "H" state of the first enable signal PLS_RISE_EN is the active state of the first enable signal PLS_RISE_EN, and the "L" state of the first enable signal PLS_RISE_EN is the inactive state of the first enable signal PLS_RISE_EN. The "L" state of the second enable signal PLS_FALL_ENB is the active state of the second enable signal PLS_FALL_ENB, and the "H" state of the second enable signal PLS_FALL_ENB is the inactive state of the second enable signal PLS_FALL_ENB.

In the IC chip main body 10, when a test signal B is input from the test signal output section 18 of the tester 22, a pulse signal (referred to below as an internal pulse signal PLS) is generated with the test signal B as a trigger. For example, the internal pulse signal PLS is generated when test signal B has been input, or when a predetermined period of time has elapsed since the test signal B was input. The generated internal pulse signal PLS is input to the internal pulse waveform shaping circuit 11.

The internal pulse waveform shaping circuit 11 is a circuit provided for monitoring separately the rise and fall of the internal pulse signal PLS, and generates an internal pulse monitor signal PLSMON. Note that the internal pulse monitor signal PLSMON generated when detecting the rise timing of the internal pulse signal PLS is generated as a signal that changes in a predetermined direction at the rise timing of the internal pulse signal PLS. The internal pulse monitor signal PLSMON generated when detecting the fall timing of the internal pulse signal PLS is also generated as a signal that changes in the same predetermined direction to the above at the fall timing of the internal pulse signal PLS.

The internal pulse monitor signal PLSMON is input to the monitor driver 12. The monitor driver 12 has the functionality of a repeater, and when input with the internal pulse monitor signal PLSMON, the monitor driver 12 outputs a signal equivalent to the input internal pulse monitor signal PLSMON to the monitor pad 13.

In a state in which a probe needle 14 is pressed against the monitor pad 13, and the monitor pad 13 and the leading end portion of the probe needle 14 are in electrical contact with each other, the signal output to the monitor pad 13 is output through the probe needle 14 to a probe card 15 external to the IC chip 20. The probe card 15 is an interface for electrically connecting the tester 22 to the IC chip 20 through the probe needle 14.

Accordingly, the internal pulse monitor signal PLSMON is input to the tester comparator 16 of the tester 22 through the probe needle 14 and the probe card 15.

The tester comparator 16 of the tester 22 is equipped with a timing detection section 16a. The timing detection section 16a detects the rise timing and the fall timing of the internal pulse signal PLS from the input signal.

The pulse width detection section 17 of the tester 22 detects the pulse width of the internal pulse signal PLS generated in the IC chip 20 based on the timing detected by the tester comparator 16. Details regarding the detection method are described later.

Figure 2:
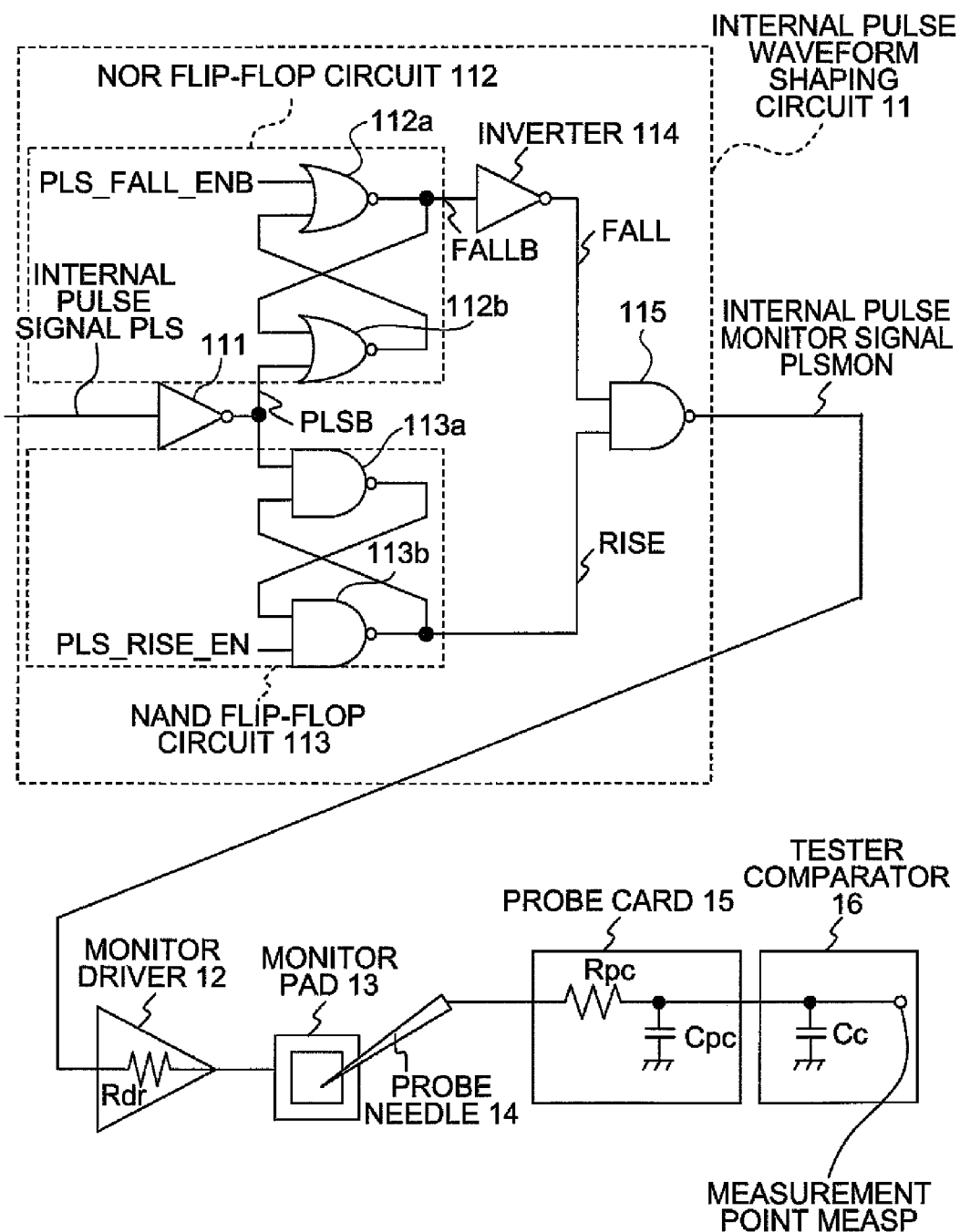
FIG. 2 is a diagram showing a detailed configuration of an internal pulse waveform shaping circuit.

FIG. 2 shows a detailed configuration of the internal pulse waveform shaping circuit 11.

The internal pulse waveform shaping circuit 11 includes an inverter 111, a NOR flip-flop circuit 112, a NAND flip-flop circuit 113, an inverter 114, and a NAND circuit 115.

The inverter 111 is a NOT circuit, and when input with the internal pulse signal PLS the inverter 111 inverts the signal and outputs an inverted signal PLSB. Namely, portions of L level of the internal pulse signal PLS waveform are converted and output at H level by the inverter 111, and portions at H level are converted and output at L level.

The NOR flip-flop circuit 112 includes a NOR circuit 112a and a NOR circuit 112b, each with 2 inputs and 1 output.

One input terminal of the NOR circuit 112a and the output terminal of the NOR circuit 112b are connected together, and the output terminal of the NOR circuit 112a and one input terminal of the NOR circuit 112b are connected together. The other input terminal of the NOR circuit 112b is connected to the output terminal of the inverter 111. The other input terminal of the NOR circuit 112a is input with the second enable signal PLS_FALL_ENB from the enable signal generating circuit 19. The NOR circuit 112a outputs an output signal FALLB according to each of the input signals.

The NAND flip-flop circuit 113 includes a NAND circuit 113a and a NAND circuit 113b, each having 2 inputs and 1 output.

One of the input terminals of the NAND circuit 113a and the output terminal of the NAND circuit 113b are connected together, and the output terminal of the NAND circuit 113a and one of the input terminals of the NAND circuit 113b are connected together. The other input terminal of the NAND circuit 113a is connected to the output terminal of the inverter 111. The other input terminal of the NAND circuit 113b is input with the first enable signal PLS_RISE_EN from the enable signal generating circuit 19. The NAND circuit 113b outputs an output signal RISE according to each of the input signals.

The output terminal of the NOR circuit 112a is connected to the input terminal of the inverter 114. The inverter 114 is a NOT circuit, and when input with the output signal FALLB output from the NOR circuit 112a, inverts the signal, and outputs the inverted signal FALL. Namely, the portions at L level of the waveform of the output signal FALLB are converted and output at H level by the inverter 114, and the portions at H level are converted and output at L level.

The NAND circuit 115 is a circuit with 2 inputs and 1 output, and the output terminal of the inverter 114 is connected to one of the input terminals of the NAND circuit 115, and the output signal FALL from the inverter 114 is input thereto. The output terminal of the NAND circuit 113b of the NAND flip-flop circuit 113 is connected to the other input terminal of the NAND circuit 115, and the output signal RISE from the NAND circuit 113b is input thereto. The NAND circuit 115 outputs the internal pulse monitor signal PLSMON according to each of the input signals.

The output terminal of the NAND circuit 115 is connected to the monitor driver 12, and the internal pulse monitor signal PLSMON is input to the monitor driver 12. The internal pulse monitor signal PLSMON is input to the tester comparator 16 through the monitor driver 12, the monitor pad 13, the probe needle 14 and the probe card 15, and is detected at the measurement point MEASP.

Note that, as shown in drawing, the internal pulse monitor signal PLSMON is delayed by the output impedance Rdr of the monitor driver 12, the wiring resistance Rpc and the capacitance Cpc of the probe card 15, and the load Cc of the tester comparator 16 upstream of the measurement point MEASP, generating waveform rounding at the measurement point MEASP. However, in the present exemplary embodiment, configuration is made such that, due to the action of the internal pulse waveform shaping circuit 11, the rise timing and the fall timing of the internal pulse signal PLS are detected and the pulse width is detected so as to be unaffected by waveform rounding.

Specific explanation now follows regarding the detection method of the rise timing and the fall timing of the internal pulse signal PLS according to the present exemplary embodiment.

First, explanation follows regarding detecting rise timing.

Figure 3A:
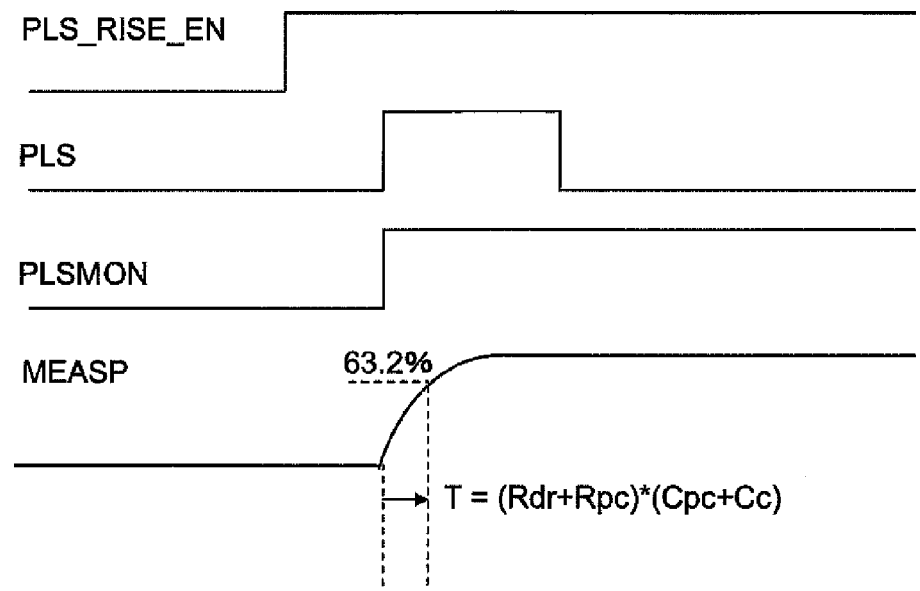
FIG. 3A is a timing chart showing waveforms of each signal when detecting rise timing.

FIG. 3A is a timing chart showing waveforms of each signal when detecting the rise timing.

The output signal FALLB of the NOR flip-flop circuit 112 is fixed so as to be at L level irrespective of the waveform of the internal pulse signal PLS when the second enable signal PLS_FALL_ENB is inactive (H). Accordingly, configuration is made such that the internal pulse monitor signal PLSMON is controlled by the output signal RISE of the NAND flip-flop circuit 113.

When detecting rise timing, the first enable signal PLS_RISE_EN is asserted before the internal pulse signal PLS is generated.

As shown in FIG. 3A, with the first enable signal PLS_RISE_EN transitioned from "L" to "H", when the input internal pulse signal PLS then becomes "H", the internal pulse monitor signal PLSMON is affected by the rise of the internal pulse signal PLS and transitions from "L" to "H". Namely, the internal pulse monitor signal PLSMON changes in the direction from L level to H level at the timing of the rise in the internal pulse signal PLS.

Thereafter, even if the internal pulse signal PLS becomes "L", the internal pulse monitor signal PLSMON does not become "L", and the internal pulse monitor signal PLSMON is maintained at H level as long as the first enable signal PLS_RISE_EN does not become "L".

Due to the affect of the transition of the internal pulse monitor signal PLSMON, the monitor driver 12 outputs a signal at "H", and at the measurement point MEASP, transition is made gradually to H level while the waveform is delayed by the time constant τ=(Rdr+Rpc)×(Cpc+Cc).

The timing detection section 16a of the tester comparator 16 compares the signal output at the measurement point MEASP with a predetermined threshold value VTH, and detects the timing (referred to below as the first timing) at which the voltage value of the signal becomes the threshold value VTH.

Note that in the present exemplary embodiment, the period (referred to below as the first period) during which the first enable signal PLS_RISE_EN is asserted (H level) and the second enable signal PLS_FALL_ENB is de-asserted, is controlled so as to be sufficiently long such that the waveform at the measurement point MEASP so as not fall before reaching the predetermined threshold value VTH (a state in which the internal pulse monitor signal PLSMON is at H level continues for a predetermined time from when the internal pulse monitor signal PLSMON has changed to H level). This length of this period is determined with reference to the maximum conceivable time constant τ in the IC chip 20 and the smallest voltage value in the conceivable variation range of the amplitude of the waveform at the measurement point MEASP.

Explanation now follows regarding detecting fall timing. Since detection of fall timing is performed separately to detection of rise timing, a different internal pulse signal PLS to the above is generated and detected.

Figure 3B:
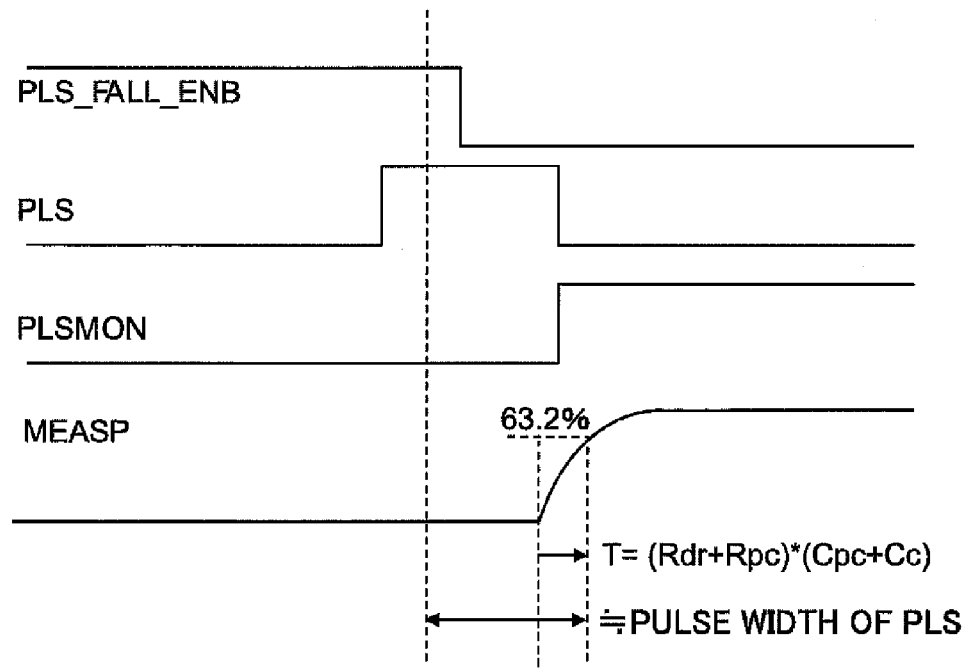
FIG. 3B is a timing chart showing waveforms of each signal when detecting fall timing.

FIG. 3B is a timing chart showing a waveform of each signal when detecting fall timing.

The first enable signal PLS_RISE_EN is de-asserted (L), and an output signal RISE of the NAND flip-flop circuit 113 is fixed at H level irrespective of the waveform of the internal pulse signal PLS. The internal pulse monitor signal PLSMON accordingly becomes controlled by the output signal FALLB of the NOR flip-flop circuit 112.

When detecting fall timing, the second enable signal PLS_FALL_ENB is asserted (L) at least in the period when the internal pulse signal PLS is being generated (prior to fall).

As shown in FIG. 3B, according to the test signal A of the test signal output section 18, the enable signal generating circuit 19 controls such that the second enable signal PLS_FALL_ENB transitions from "H" to "L" in the period during which the internal pulse signal PLS is "H".

The second enable signal PLS_FALL_ENB is transitioned from "H" to "L", and then when the internal pulse signal PLS becomes "L", the internal pulse monitor signal PLSMON is affected by the fall of the internal pulse signal PLS, and transitions from "L" to "H". Namely, the internal pulse monitor signal PLSMON changes in the direction from L level to H level at the fall timing of the internal pulse signal PLS.

Thereafter, the internal pulse monitor signal PLSMON is maintained at H level as long as the second enable signal PLS_FALL_ENB does not become "H".

The monitor driver 12 is affected by the transition of the internal pulse monitor signal PLSMON and outputs an "H" signal, and at the measurement point MEASP there is transition of the signal to H level with the waveform delayed by the time constant τ=(Rdr+Rpc)×(Cpc+Cc).

The timing detection section 16a of the tester comparator 16 compares the signal output at the measurement point MEASP with a predetermined threshold value VTH, and detects the timing (referred to below as the second timing) at which the voltage value of the signal becomes that of the threshold value VTH.

Note that in the present exemplary embodiment, the period (referred to below as the second period) during which the first enable signal PLS_RISE_EN is de-asserted and the second enable signal PLS_FALL_ENB is asserted, similarly to the first period, is controlled so as to be sufficiently long such that the waveform output at the measurement point MEASP does not fall prior to reaching the predetermined threshold value VTH (a state in which the internal pulse monitor signal PLSMON is at H level continues for a predetermined time from when the internal pulse monitor signal PLSMON changes to H level).

The pulse width detection section 17 of the tester 22 detects, as the pulse width of the internal pulse signal PLS generated in the IC chip 20, the difference between the time from a predetermined first reference timing to the above detected first timing and the time from a predetermined second reference timing to the above detected second timing.

Explanation now follows regarding the first reference timing and the second reference timing. As mentioned above, when input with the test signal B from the test signal output section 18 of the tester 22, the IC chip main body 10 generates the internal pulse signal PLS as triggered by the test signal B. The timing at which the test signal B is input to the IC chip main body 10, or a timing after a predetermined duration has elapsed after the test signal B has been input, is used as a reference timing as a reference for generation of the internal pulse signal PLS. In order to discriminate between the reference timing used as a reference for pulse signal generation when detecting a rise timing, and the reference timing used as a reference for pulse signal generation when detecting a fall timing, the reference timing when detecting rise timing will be referred to here as the first reference timing, and the reference timing when detecting fall timing will be referred to as the second reference timing.

As described above, detecting the rise timing and detecting the fall timing of the internal pulse signal PLS differ only in the timing with which the internal pulse monitor signal PLSMON changes from "L" to "H", and the direction of change of the internal pulse monitor signal PLSMON is the same for both. Accordingly, for example as shown in FIG. 3, when the rise timing and the fall timing are each individually detected using as a determination point (VTH) a voltage value of 63.2% of the maximum voltage value of the waveform measured at the measurement point MEASP, the deltas of each of these timings from their respective reference timings, with time constant τ=(Rdr+Rpc)×(Cpc+Cc), cancel each other out, and the pulse width of the internal pulse signal PLS can be accurately detected irrespective of the time constant τ.

As explained above, according to the present exemplary embodiment it is possible to accurately detect the pulse width of the internal pulse signal PLS by a simple method with a fixed determination voltage point (the above threshold value VTH), irrespective of the output impedance Rdr of the monitor driver 12, the wiring resistance Rpc and the capacitance Cpc of the probe card 15, and the load Cc of the tester comparator 16, which fluctuate with transistor parameters.

Note that while in the above exemplary embodiment an internal pulse waveform shaping circuit employing a NOR and a NAND flip-flop circuit is used, there is no limitation to such a circuit. Any circuit that can output signals that change separately, and in the same phase (in the same direction), with the rise timing and the fall timing of the internal pulse signal PLS may be employed. It is possible to cancel out the delay values resulting from the time constant, such as of the output impedance of the monitor driver 12 and the like, by outputting with the same phase.

Figure 4:
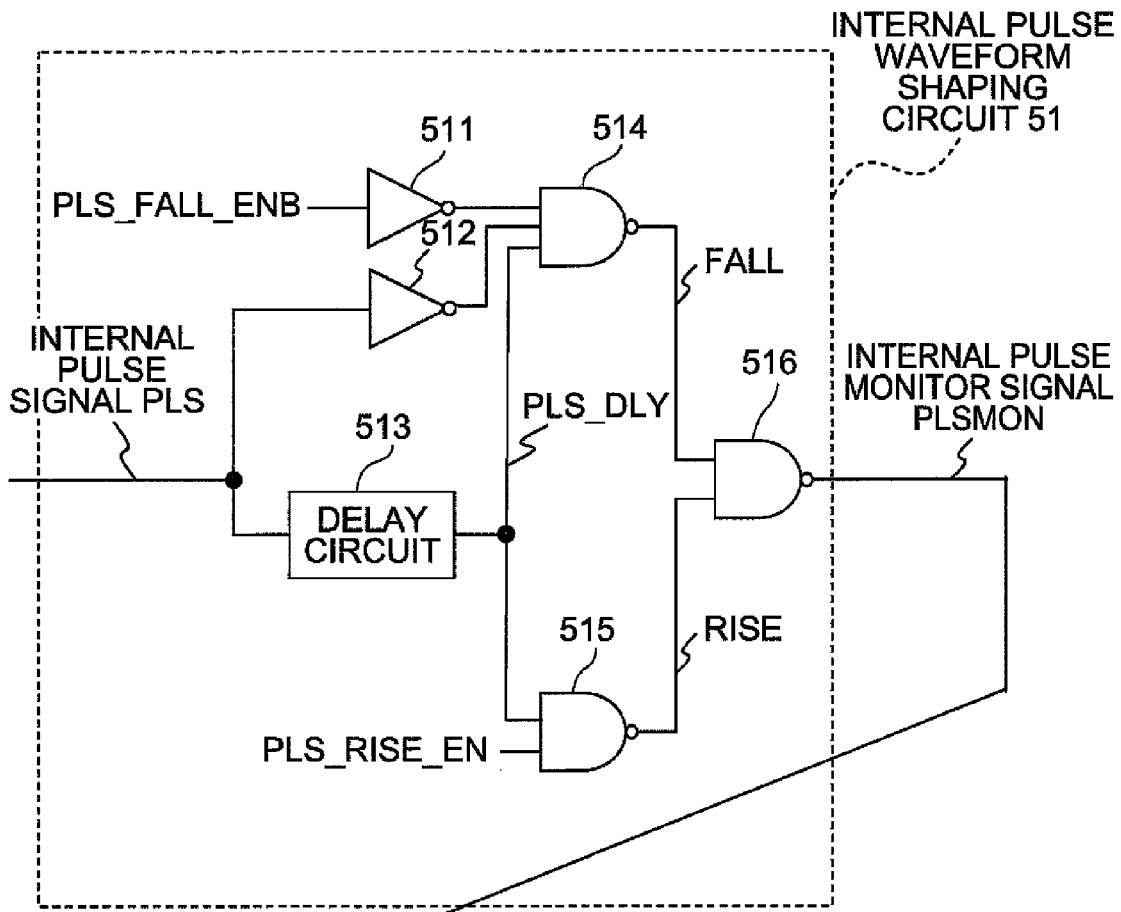
FIG. 4 is a diagram showing a modified example of an internal pulse waveform shaping circuit.
Figure 4:
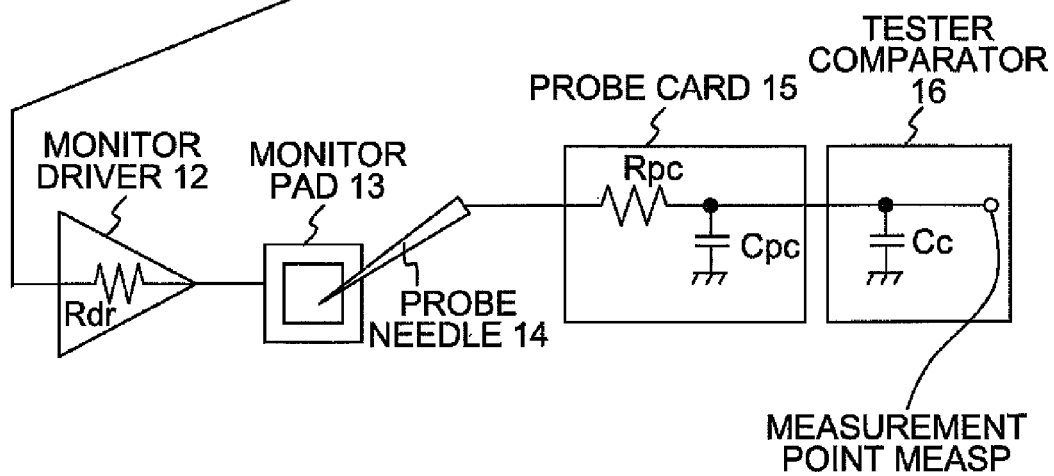

FIG. 4 shows a modified example of an internal pulse waveform shaping circuit. As shown in FIG. 4, an internal pulse waveform shaping circuit 51 configured differently to the internal pulse waveform shaping circuit 11 is provided to the IC chip 20. The internal pulse waveform shaping circuit 51 includes two inverters 511, 512, a delay circuit 513, and three NAND circuits 514, 515, 516.

When input with a second enable signal PLS_FALL_ENB, the inverter 511 inverts and outputs the signal. When input with the internal pulse signal PLS, the inverter 512 inverts and outputs the signal. The delay circuit 513 delays the fall timing of the input internal pulse signal PLS by a predetermined delay timing, and then outputs a delayed signal PLS_DLY.

The NAND circuit 514 is a circuit with 3 inputs and 1 output, and is input with each of the output signals of the invertors 511, 512 and the delay circuit 513. The NAND circuit 514 outputs an output signal FALL according to the input signals.

The NAND circuit 515 is a circuit with 2 inputs and 1 output, with the delayed signal PLS_DLY delayed by the delay circuit 513 input to one of the input terminals, and the first enable signal PLS_RISE_EN input to the other input terminal.

The NAND circuit 516 is a circuit with 2 inputs and 1 output, the output terminal of the NAND circuit 514 is connected to one of the input terminals, and the output terminal of the NAND circuit 515 is connected to the other of the input terminals. The NAND circuit 516 outputs an internal pulse monitor signal PLSMON according to each of the signals input.

The output terminal of the NAND circuit 516 is connected to the monitor driver 12, and the internal pulse monitor signal PLSMON is input to the monitor driver 12. The internal pulse monitor signal PLSMON is input to the tester comparator 16 through the monitor driver 12, the monitor pad 13, the probe needle 14, and the probe card 15, and detected at the measurement point MEASP.

Explanation now follows regarding a specific method for detecting the rise timing and fall timing of the internal pulse signal PLS with such a configuration.

First explanation follows regarding detecting rise timing.

Figure 5A:
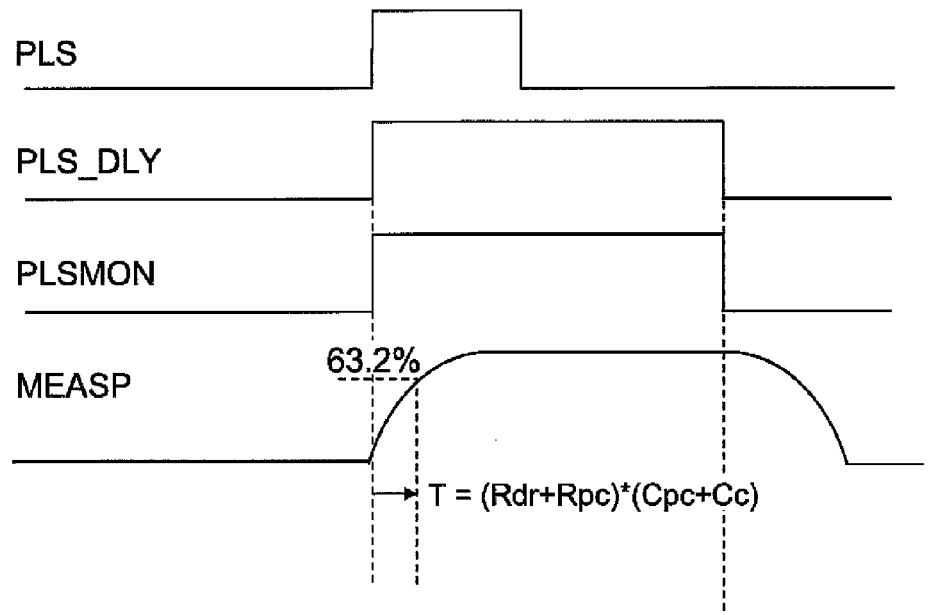
FIG. 5A is a timing chart showing waveforms of each signal when detecting rise timing in a modified example.

FIG. 5A is a timing chart showing waveforms of each signal when detecting rise timing.

The second enable signal PLS_FALL_ENB here is de-asserted (H) so as to fix the output signal FALL of the NAND circuit 514 at H level, irrespective the waveform of the internal pulse signal PLS. Accordingly, the internal pulse monitor signal PLSMON is controlled by the output signal RISE of the NAND circuit 515.

When detecting rise timing, the first enable signal PLS_RISE_EN is asserted (H) prior to generation of the internal pulse signal PLS.

After the first enable signal PLS_RISE_EN has been transitioned from "L" to "H", as shown in FIG. 5A, when the input internal pulse signal PLS becomes "H", the output signal RISE of the NAND circuit 515 becomes "L", and as a result the internal pulse monitor signal PLSMON that is output from the NAND circuit 516 changes from "L" to "H".

Thereafter, even if the internal pulse signal PLS becomes "L", the internal pulse monitor signal PLSMON does not immediately become "L" due to the delay circuit 513, and only becomes "L" when the above predetermined period has elapsed or later. Namely, the internal pulse monitor signal PLSMON is maintained at "H" for the predetermined period.

The timing detection section 16a of the tester comparator 16 compares the signal output at the measurement point MEASP with the predetermined threshold value VTH, and detects the timing (first timing) at which the voltage value of the signal becomes the threshold value VTH.

Explanation now follows regarding fall timing detection. Fall timing detection is performed separately to rise timing detection, and an internal pulse signal PLS separate from the above is generated and detected.

Figure 5B:
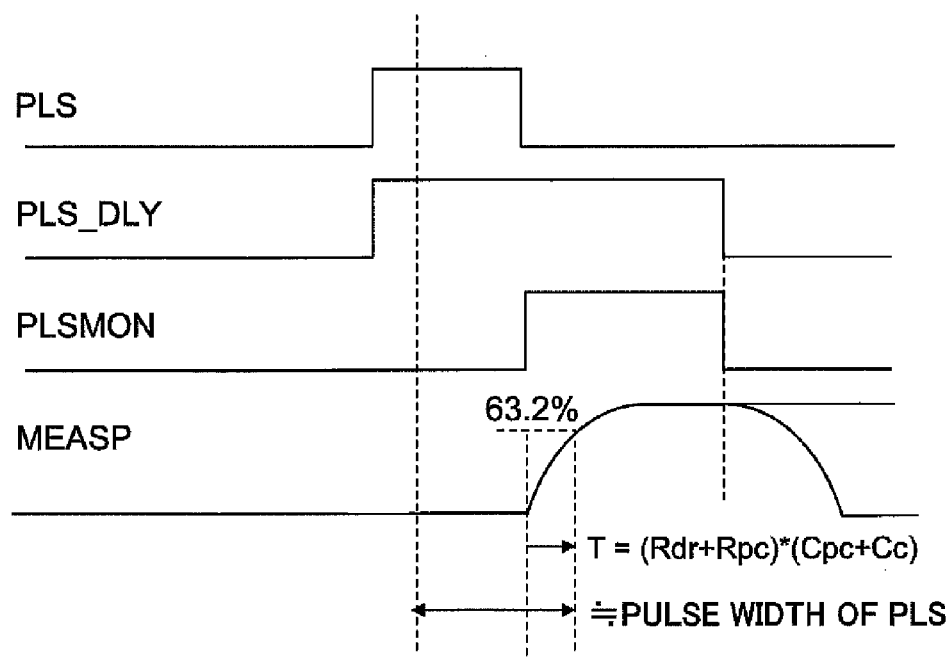
FIG. 5B is a timing chart showing waveforms of each signal when detecting fall timing in a modified example.
Figure 6:
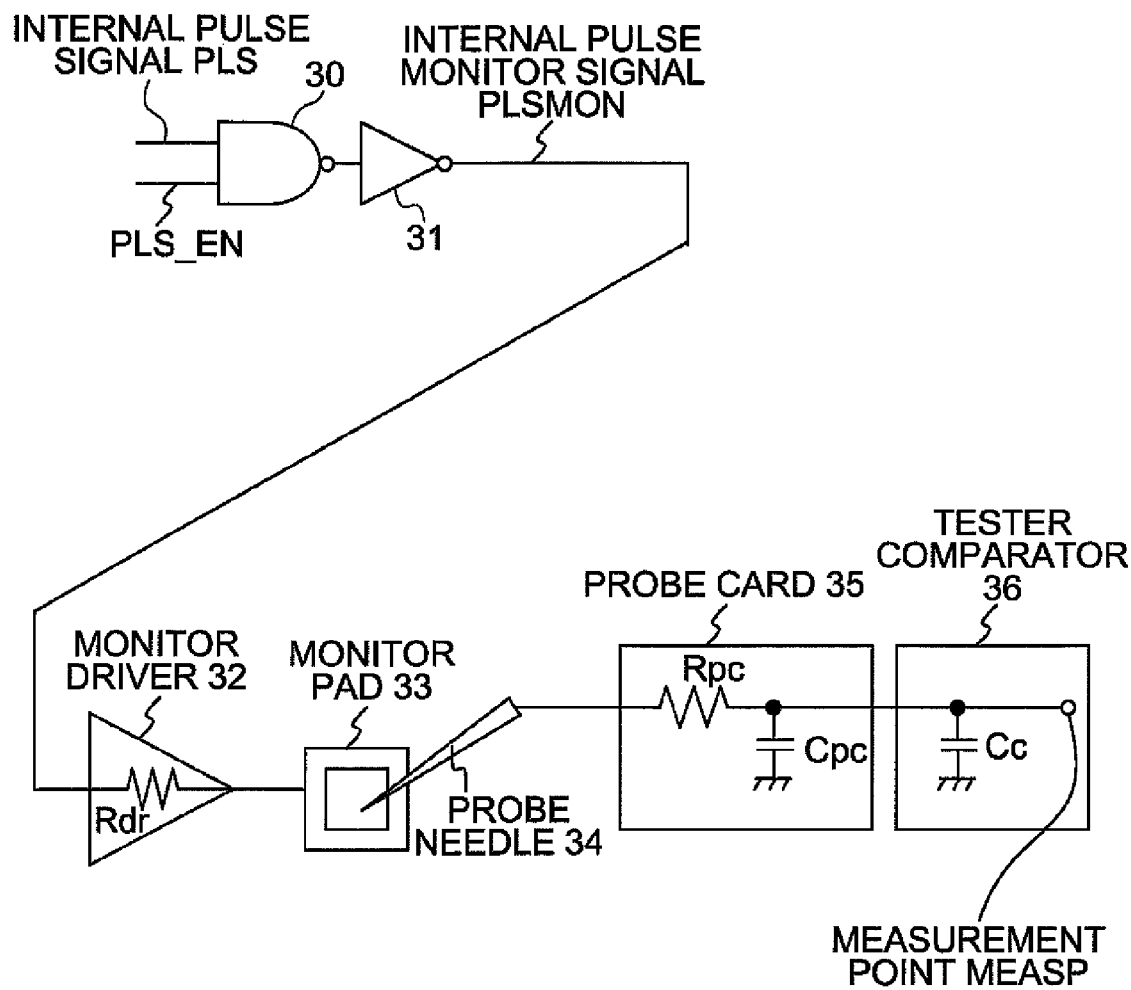
FIG. 6 is an explanatory diagram for explaining a conventional pulse width detection method.
Figure 7:
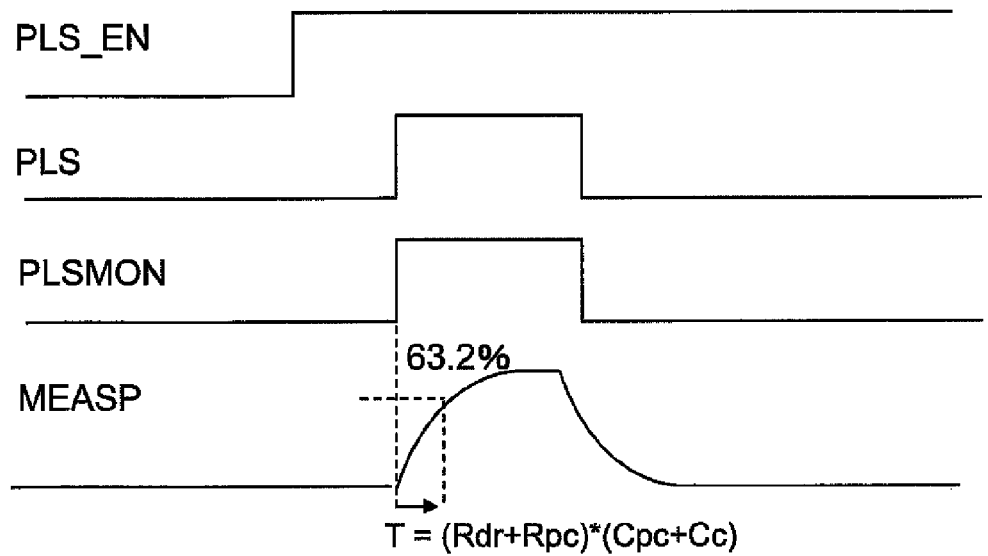
FIG. 7 is a timing chart showing waveforms of each single in the conventional detection method of FIG. 6.
Figure 8:
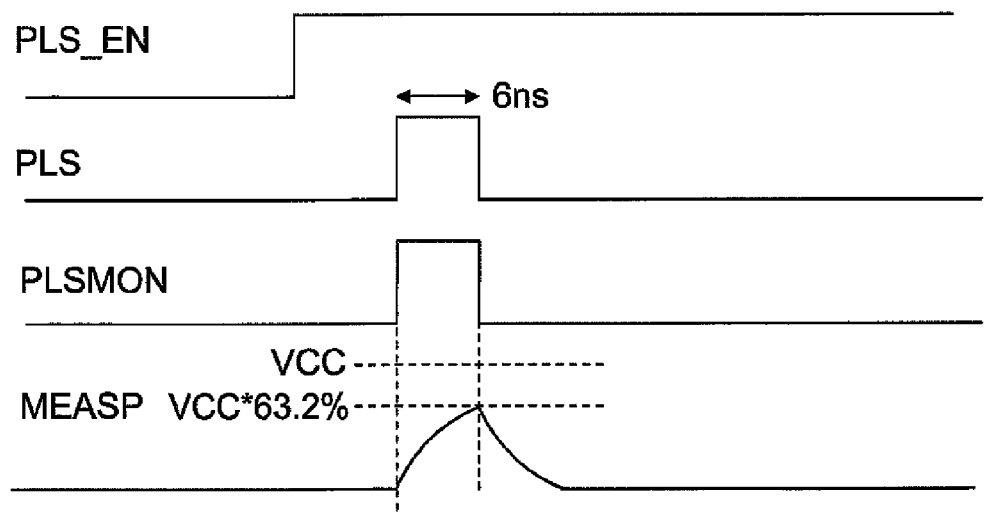
FIG. 8 is an explanatory example for explaining a specific example of a time constant and waveform rounding according to the time constant.

FIG. 5B is a timing chart showing the waveforms of each of the signals when detecting fall timing.

The first enable signal PLS_RISE_EN here is de-asserted (L) so as to fix the output signal RISE of the NAND circuit 515 at H level irrespective of the waveform of the internal pulse signal PLS. Accordingly, the internal pulse monitor signal PLSMON is controlled by the output signal FALL of the NAND circuit 514.

When detecting the fall timing, the second enable signal PLS_FALL_ENB is asserted (L) at least while the internal pulse signal PLS is being generated (prior to fall).

The second enable signal PLS_FALL_ENB is transitioned from "H" to "L", then when the internal pulse signal PLS becomes "L", the internal pulse monitor signal PLSMON is affected by the fall of the internal pulse signal PLS, and changes from "L" to "H".

Then, the internal pulse monitor signal PLSMON is maintained at "H" level until the delayed signal PLS_DLY falls.

The monitor driver 12 is affected by the transition of the internal pulse monitor signal PLSMON and outputs a signal at "H", and the signal at the measurement point MEASP transitions to "H" delayed by the time constant $\tau=(Rdr+Rpc)\times(Cpc+Cc)$.

The timing detection section 16a of the tester comparator 16 compares the signal output at the measurement point MEASP to a predetermined threshold value VTH, and detects the timing at which the voltage value of the signal reaches the threshold value VTH (second timing).

The delay period due to the delay circuit 513 is controlled so as to be sufficiently long such that the waveform at the measurement point MEASP does not fall before reaching the above predetermined threshold value VTH (a state in which the internal pulse monitor signal PLSMON is H level continues for a predetermined period after the internal pulse monitor signal PLSMON has changed to H level). This length is determined with reference to the maximum conceivable time constant $\tau$ in the IC chip 20, and the minimum voltage value in the range of conceivable variations in amplitude of the waveform at the measurement point MEASP.

Similarly to the previous exemplary embodiment, the pulse width detection section 17 of the tester 22 detects, as the pulse width of the internal pulse signal PLS generated in the IC chip 20, the difference between the time from a predetermined first reference timing to the above detected first timing and the time from a predetermined second reference timing to the above detected second timing.

In this modified example too, detecting the rise timing and detecting the fall timing of the internal pulse signal PLS differ only in the timing when the internal pulse monitor signal PLSMON changes from "L" to "H", and the direction of change of the internal pulse monitor signal PLSMON is the same in both cases. Accordingly, for example, as shown in FIGS. 5A and 5B, when the rise timing and the fall timing are individually detected with a determination point (VTH) as a voltage value of 63.2% of the maximum voltage value of the waveform measured at the measurement point MEASP, the deltas of each of these timings from their reference timings, with the time constant $\tau=(Rdr+Rpc)\times(Cpc+Cc)$, cancel each other out, and the pulse width of the internal pulse signal PLS can be accurately detected irrespective of the time constant $\tau$.

Note that while in the above exemplary embodiment and modified example explanation has been given of cases in which the determination point (threshold value VTH) is 63.2% of the amplitude of an average IC chip 20, there is no limitation thereto, as long as a value is employed for the threshold value VTH that can determine the output waveform without error, and the same threshold value is employed during rise timing detection and during fall timing detection.

Furthermore, while in the above exemplary embodiment and modified example explanation has been given of cases in which the internal pulse signal PLS was a signal at "H" during generation, application can be made to a pulse signal that is "L" during pulse generation.

Furthermore, while in the above exemplary embodiment and modified example, explanation has been given of cases in which the change direction of the internal pulse monitor signal PLSMON indicating the rise timing and the fall timing of the internal pulse signal PLS is a change from "L" to "H", however there is no imitation thereto and an internal pulse monitor signal PLSMON that changes in the opposite direction may be employed. For example, the NAND circuit 115 of FIG. 2 and the NAND circuit 516 of FIG. 4 may be replaced with AND circuits, or an inverter inserted at a stage subsequent to the NAND circuit 115 and the NAND circuit 516.

Furthermore, while in the above exemplary embodiment and modified example explanation has been given of examples of detecting the pulse width of an internal pulse signal PLS in a wafer test on each of the IC chips 20 when on a wafer, a similar method can detect the pulse width at final testing (screening testing) performed after each of the IC chips 20 have been separated from the wafer and assembled.

What is claimed is:

1. A semiconductor device comprising a generation section and an output section, wherein:
   the generation section is input with a pulse signal generated in the semiconductor device, a first enable signal asserted when detecting a rise timing of the pulse signal, and is input with a second enable signal asserted when detecting a fall timing of the pulse signal;
   the generation section generates a first signal that changes in a predetermined direction at a rise timing of the input pulse signal, during a period in which the input first enable signal is asserted and then continues in a changed state for a predetermined duration or longer;
   the generation section generates a second signal that changes in the predetermined direction at a fall timing of the input pulse signal, during a period in which the input second enable signal is asserted and then continues in the changed state for the predetermined duration or longer; and
   wherein the output section outputs the generated first signal and the generated second signal to a detection device provided externally to the semiconductor device, the detection device for detecting the pulse width of the pulse signal based on the generated first signal and the generated second signal.

2. The semiconductor device of claim 1, wherein:
   the first enable signal is a signal asserted when signal level is H;
   the second enable signal is a signal asserted when signal level is L:
   the generation section comprises a first NOT circuit, a NAND flip-flop circuit, a NOR flip-flop circuit, a second NOT circuit, and a third NAND circuit;
   the first NOT circuit is input with the generated pulse signal;
   the NAND flip-flop circuit comprises a first NAND circuit and a second NAND circuit;
   a first input terminal of the first NAND circuit and an output terminal of the second NAND circuit are connected together in the NAND flip-flop circuit;
   an output terminal of the first NAND circuit and a first input terminal of the second NAND circuit are connected together in the NAND flip-flop circuit;
   a second input terminal of the first NAND circuit and an output terminal of the first NOT circuit are connected together in the NAND flip-flop circuit;
   the NAND flip-flop circuit is input with the first enable signal at a second input terminal of the second NAND circuit;
   the NOR flip-flop circuit comprises a first NOR circuit and a second NOR circuit;
   a first input terminal of the first NOR circuit and an output terminal of the second NOR circuit are connected together in the NOR flip-flop circuit;
   an output terminal of the first NOR circuit and a first input terminal of the second NOR circuit are connected together in the NOR flip-flop circuit;
   a second input terminal of the second NOR circuit and the output terminal of the first NOT circuit are connected together in the NOR flip-flop circuit;
   the second enable signal is input to the NOR flip-flop circuit at a second input terminal of the first NOR circuit;
   an input terminal of the second NOT circuit is connected to the output terminal of the first NOR circuit of the NOR flip-flop circuit;
   a first input terminal of the third NAND circuit and the output terminal of the second NAND circuit of the NAND flip-flop circuit are connected together, and a second input terminal of the third NAND circuit and an output terminal of the second NOT circuit are connected together;
   wherein the generation section generates the first signal, which changes from L to H, at a rise timing of the input pulse signal, during a period in which the first enable signal is asserted and then continues in the changed state for the predetermined duration or longer, and outputs the first signal from an output terminal of the third NAND circuit; and
   wherein the generation section generates the second signal, which changes from L to H, at a fall timing of the input pulse signal, during a period in which the second enable signal is asserted and then continues in the changed state for the predetermined duration or longer, and outputs the second signal from the output terminal of the third NAND circuit.

3. The semiconductor device of claim 1, wherein:
   the first enable signal is a signal asserted when signal level is H;
   the second enable signal is a signal asserted when signal level is L:
   the generation section comprises a delay circuit, a first NAND circuit, a first NOT circuit, a second NOT circuit, a second NAND circuit, and a third NAND circuit;
   the delay circuit is input with the generated pulse signal and outputs a delayed signal that is delayed by a predetermined delay period from the fall timing of the input pulse signal;
   a first input terminal of the first NAND circuit is input with the delayed signal that has been delayed by the delay circuit, and a second input terminal of the first NAND circuit is input with the first enable signal;
   the first NOT circuit is input with the second enable signal;
   the second NOT circuit is input with the generated pulse signal;

a first input terminal of the second NAND circuit is connected to an output terminal of the first NOT circuit;

a second input terminal of the second NAND circuit is connected to an output terminal of the second NOT circuit;

a third input terminal of the second NAND circuit is input with the delayed signal that has been delayed by the delay circuit;

a first input terminal of the third NAND circuit is connected to an output terminal of the first NAND circuit;

a second input terminal of the third NAND circuit is connected to an output terminal of the second NAND circuit;

wherein the generation section generates the first signal, which changes from L to H, at a rise timing of the input pulse signal, during a period in which the first enable signal is asserted and then continues in the changed state for the predetermined duration or longer, and outputs the first signal from an output terminal of the third NAND circuit; and wherein the generation section generates the second signal, which changes from L to H, at a fall timing of the input pulse signal during a period in which the second enable signal is asserted and then continues in the changed state for the predetermined duration or longer, and outputs the second signal from the output terminal of the third NAND circuit.

4. A pulse width detection method for a semiconductor device comprising a generation section and an output section, the pulse width detection method comprising:

inputting to the generation section a pulse signal generated in the semiconductor device, a first enable signal asserted when detecting a rise timing of the pulse signal generated in the semiconductor device, and a second enable signal asserted when detecting a fall timing of the pulse signal;

generating at the generation section a first signal that changes in a predetermined direction at a rise timing of the input pulse signal, during a first period in which the input first enable signal is asserted and then continues in a changed state for a predetermined duration or longer;

generating at the generation section a second signal that changes in the predetermined direction at a fall timing of the input pulse signal, during a second period in which the input second enable signal is asserted and then continues in the changed state for the predetermined duration or longer;

outputting at the output section the generated first signal and the generated second signal to a detection device provided externally to the semiconductor device, the detection device for detecting the pulse width of the pulse signal based on the generated first signal and the generated second signal;

detecting at the detection device a first timing at which the first signal has changed in the predetermined direction by comparing the first signal output from the output section with a predetermined threshold value;

detecting at the detection device a second timing at which the second signal has changed in the predetermined direction by comparing the second signal output from the output section with the predetermined threshold value: and detecting at the detection device the pulse width of the pulse signal generated in the semiconductor device, in which the pulse width corresponds to a difference between a period of time from a first reference timing used as a reference timing for generating the pulse signal input in the first period up to the detected first timing, and a period of time from a second reference timing used as a reference timing for generating the pulse signal input in the second period up to the detected second timing.

5. A semiconductor device comprising:

an IC chip including a generating section having as input a pulse signal generated in the IC chip, a first enable signal asserted when a rise timing of the pulse signal is detected, and a second enable signal asserted when a fall timing of the pulse signal is detected, the generating section configured to generate a first signal that changes in a predetermined direction at a rise timing of the input pulse signal, during a period in which the input first enable signal is asserted and then continues in a changed state for a predetermined duration or longer, and to generate a second signal that changes in the predetermined direction at a fall timing of the input pulse signal, during a period in which the input second enable signal is asserted and then continues in the changed state for the predetermined duration or longer, and an output section configured to output the generated first and second signals externally from the IC chip; and a detection device configured to detect the pulse width of the pulse signal based on the generated first and second signals.

* * * * *